(12) United States Patent
Sekine

(10) Patent No.: US 6,246,973 B1
(45) Date of Patent: Jun. 12, 2001

(54) MODELING METHOD OF MOSFET

(75) Inventor: Satoshi Sekine, Sendai (JP)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/372,860

(22) Filed: Aug. 12, 1999

(30) Foreign Application Priority Data

Aug. 14, 1998 (JP) .................................................. 10-244416

(51) Int. Cl.$^7$ .............................. G06G 7/48; G06F 17/50
(52) U.S. Cl. .................................. 703/4; 703/13; 703/15
(58) Field of Search ..................................... 703/15, 4, 13

(56) References Cited

U.S. PATENT DOCUMENTS 5,606,518 * 2/1997 Fang et al. .............................. 703/13
5,821,766 * 10/1998 Kim et al. .............................. 324/769

OTHER PUBLICATIONS

Hsueh et al.; "Inverse–narrow–width effects and small–geometry MOSFET threshold voltage model"; IEEE Trans. Elect. Dev.; pp. 325–338, Mar. 1988.*

Tewksbury et al.; "Characterization, modeling, and minimization of transient threshold voltage shifts in MOSFET's"; IEEE J. Solid–State Circuits; pp. 239–252, Mar. 1994.*

* cited by examiner

Primary Examiner—Kevin J. Teska
Assistant Examiner—Hugh Jones
(74) Attorney, Agent, or Firm—Robert F. Hightower

(57) ABSTRACT

The objective is to accurately determine the effective value of channel width in accordance with the design value of channel width when the channel width is scaled down, thereby accurately modeling the electrical characteristic of a MOSFET. An error $\Delta W1$ based on the length of the region extending from the field oxide film to the gate oxide film, an error $\Delta W2$ based on the "effect of stress" that occurs when the design value W of channel width is scaled down, and an error $\Delta W3$ based on the "effect of lithography" that occurs when the design value L of channel length is scaled down, are predetermined with respect to various values of W and L, and the effective value We of channel width is determined according to an equation: $We = W - \Delta W1 + \Delta W2 + \Delta W3$. The resulting effective value We is used to model the electrical characteristic of the device.

5 Claims, 8 Drawing Sheets

MODELING METHOD OF MOSFET

FIELD OF THE INVENTION

The present invention relates to a modeling method of MOSFET (metal-oxide semiconductor field effect transistor).

BACKGROUND OF THE INVENTION

FIGS. 13 and 14 show a schematic plan view of a MOSFET and a cross-sectional view along I—I thereof to explain the structure of the MOSFET. In FIG. 13, reference numeral 11 denotes an active area; 12 denotes a gate electrode; 13 denotes a contact portion to a drain electrode in a drain region; and 14 denotes a contact portion to a source electrode in a source region. In the main cross-section (FIG. 14) along I—I that traverses the active region 11 along the gate electrode 12, reference numerals 10, 15, and 16 denote a substrate, a gate oxide film, and field oxide film, respectively.

Normally, the field oxide film 16 is obtained by forming a heat-resistant nitride film, such as, for example, silicon nitride film, on the substrate, and, after the nitride film is patterned by photolithography to a desired geometry, thermally oxidizing the substrate 10 using the remaining nitride film as a mask. During thermal oxidation, a so-called bird's beak is formed in a region extending from the field oxide film 16 to the subsequently formed gate oxide film 15; thus, the effective channel width related to the electrical characteristics of the resulting device, that is, the effective value We of channel width, is smaller than its design value on both sides of the gate oxide film 15 by $\Delta W1/2$, respectively, or by $\Delta W1$ in total.

Typically, the electrical characteristic of the MOSFET is characterized (modeled) in advance, and then MOSFET-based integrated circuitry is designed by using the model. Conventionally, when the electrical characteristic of the MOSFET is modeled, Eq. (1) shown below is applied to the design value W of channel width in consideration of the above-mentioned bird's beak to determine the effective value We of channel width, which is used as a channel width.

$$We = W - (\Delta W1/2 + \Delta W1/2) = W - \Delta W1 \qquad \text{Eq. (1)}$$

Eq. (1) indicates that the transistor gain of the MOSFET is zero until the design value W of channel width reaches a certain value, that is, $\Delta W1$; thus, it can be said that $\Delta W1$ is an offset value for W. Here, $\Delta W1$ is a fixed value in the MOSFET manufacturing process, and is handled as an independent parameter of the channel width design value W.

However, with the correction of the channel width due to Eq. (1) above, as the channel width becomes more scaled down, the above $\Delta W1$ is not actually fixed, so there is a problem that a difference between the device characteristic predicted and the device characteristic resulting from actual fabrication is considerable.

Thus, for MOSFET modeling for a smaller channel width, a channel width correction equation, as shown in Eq. (2) below, has been proposed considering We varies according to the magnitude of the gate bias (Proc, IEEE Int. Conference on Microelectronic Test Structures, 133–137, Vol. 6, March 1993). Note that Gw (Vgs–Vth) in Eq. (2) represents a term that varies with the gate bias.

$$We = W + \Delta W + Gw(Vgs - Vth) \qquad \text{Eq. (2)}$$

By considering the dependency of the gate bias as shown in FIG. 2, correction can be made to some degree when the channel width is scaled down; however, there is a problem that modeling is complex and difficult. Additionally, when the channel width is scaled down, the final geometry is physically different than when the channel width is larger; the resulting influence is greater than the gate bias dependency.

It has also been proposed that a so-called Binning method be employed to correct the channel width. The Binning method involves dividing the W/L matrix into multiple areas according to the model fitting accuracy, where W and L are the design values of channel width and channel length, respectively, and performing characterization by use of Eq. (1) for each area, thereby achieving correction in greater detail according to the value of W/L.

With the Binning method, however, there are problems that if the value of W/L is on the boundary of the areas, it is unknown which modeling parameter should better be used, and handling of this case is inconvenient; it is difficult to assure continuity of models between areas; and all of the W/L values cannot be characterized (modeled) accurately. Furthermore, the modeling is complex.

Accordingly, it is an object of the present invention to provide a modeling method of MOSFET that can accurately and simply determine the effective value of channel width based on the design value of channel width when the channel width is scaled down, thereby accurately predicting the electrical characteristic of the MOSFET.

SUMMARY OF THE INVENTION

The present invention is implemented based on the finding that the error between the effective value We and design value W of channel width is due not only to $\Delta W1$ but also to additional two factors. It is assumed here that the errors corresponding to those two factors are $\Delta W2$ and $\Delta W3$, respectively. The effective value We of channel width is then given by Eq. (3) below.

$$We = W - \Delta W1 + \Delta W2 + \Delta W3 \qquad \text{Eq. (3)}$$

where $\Delta W1$ is similar to the prior art, which is first described below. If the design value L of channel length is small, a value of $\Delta W3$ occurs; as such, L is increased somewhat and set so that $\Delta W3$ does not occur; the gate-to-source transistor gain is measured while varying the design value of channel width, thereby determining the relationship between W and transistor gain. If W is too small, $\Delta W2$ occurs; as such, for values of W that are greater than that, the relationship between W and transistor gain is determined, thereby resulting in a linear regression line as shown in FIG. 2. This linear regression line ramps up from a point that is offset from zero; when W is scaled down, the gate-to-source transistor gain is essentially zero. Thus, the value of W where the transistor gain starts to become an effective value greater than zero is regarded as $\Delta W1$.

Next, an explanation on $\Delta W2$ is given. The length of the afore-described bird's beak, that is, the distance from the edge of the silicon nitride film 21 to the gate oxide film 15, is longer (k2) as the channel width becomes wider as shown in FIG. 3 (b), while it is shorter (k1) as the channel width becomes narrower as shown in FIG. 3 (a) (P. U. Kenkare IEDM 1993,p479–482). In other words, as the channel width becomes smaller, the effective value We of channel width becomes longer. Typically, the geometry of the active area 11 near the gate region includes several types, as shown in FIGS. 4 (a)–(c). For the type shown in FIG. 4 (a), the design value W of channel width is relatively large (W≧1.6 μm) and the active area 11 is rectangular in shape; for the type shown in FIG. 4 (b), the design value of channel width is scaled down (W<1.6 μm), with a shorter channel length, so the active area 11 is in so-called "dog bone" shape; for the type shown in FIG. 4 (c), it has a dog-bone shape, with a narrow channel width, but with a longer channel length. As shown in FIG. 4 (c), in an area where the channel width is smaller, the effective value We of channel width is greater than the design value W of channel width. This effect is referred to herein as "effect of stress," and an error that occurs between W and We due to this "effect of stress" is regarded as ΔW2.

Next, an explanation on ΔW3 is given. If the design value W of channel width is scaled down and the design value L of channel length is scaled down, the geometry of the channel region spreads like a web, as shown in FIG. 4 (b) This is because the corners on the source and drain sides of the channel region are rounded due to light diffraction in photolithography and they influence each other. This effect is referred to herein as "effect of lithography," and an error that occurs between W and We due to this "effect of lithography" is regarded as ΔW3.

DESCRIPTION OF A PREFERRED EMBODIMENTS

One example of MOSFET modeling method according to the present invention is described below with reference to the drawings. This modeling method is intended to model (characterize) an electrical characteristic of the MOSFET by use of Eq. (3) above, the procedure of which is described with reference to the flow chart of FIG. 1.

First, as described in "Means to Fix the Problem," the design value L of channel length is set to such a degree that the "effect of lithography" does not occur, for example, 25 μm, and MOSFETs are fabricated while varying the design value W of channel width. For each of the MOSFETs, its gate-to-source transistor gain is measured, and a relationship (linear equation) between W and transistor gain is determined in a range where the "effect of stress" does not occur (for example, W≧1.6 μm) (Step 1). Using the resulting relationship, the value of W when the transistor gain is zero, that is, ΔW1, is determined (Step 2).

Next, as described in "Means to Fix the Problem," of the data determined in Step 1, the data in a range where W is scaled down so that the "effect of stress" occurs (for example, W<1.6μm) is used to determine a function for deriving ΔW2 (Step 3).

Figure 2A:
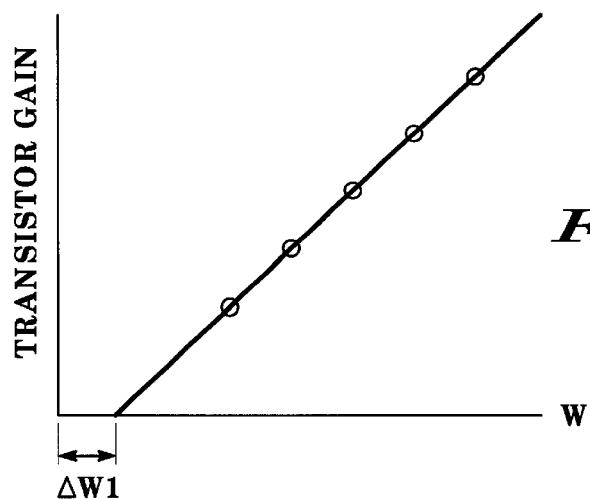
FIGS. 2A–2B is a graph for schematically illustrating a relationship between design value W of channel width and gate-to-source transistor gain for purposes of explaining ΔW1 and ΔW2.
Figure 2B:
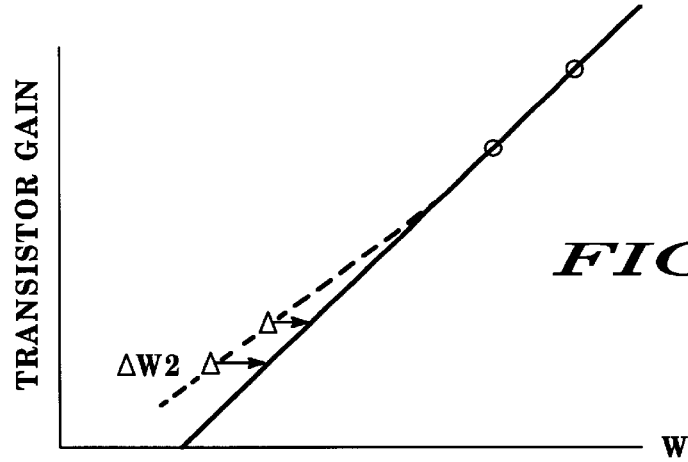
Figure 3A:
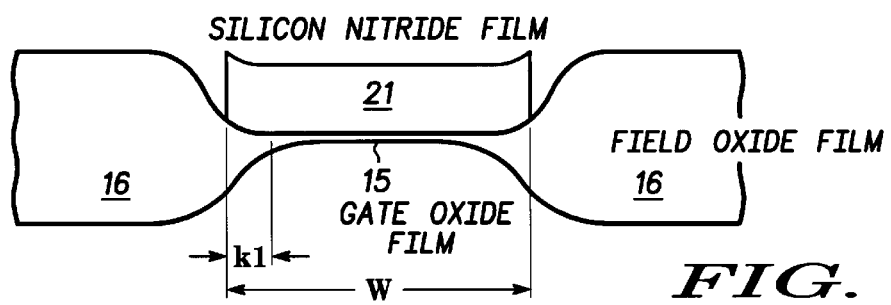
FIGS. 3A–3B is a cross-sectional view for schematically illustrating the MOSFET with the field oxide film formed for purposes of explaining the "effect of stress" that results in ΔW2.
Figure 3B:
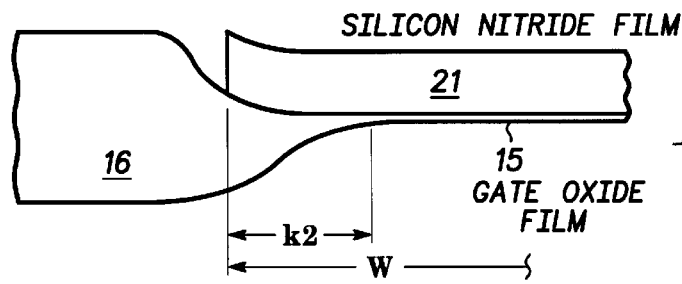
Figure 4A:
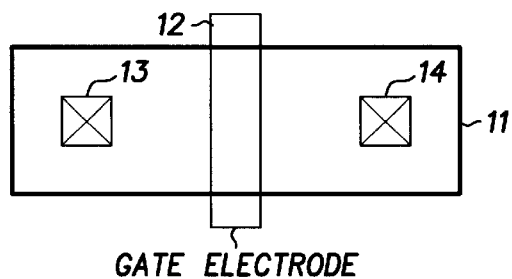
FIGS. 4A–4C is a planar cross-sectional view for schematically illustrating the MOSFET for purposed of explaining the "effect of stress" that results in ΔW2 and the "effect of lithography" that results in ΔW3.
Figure 4B:
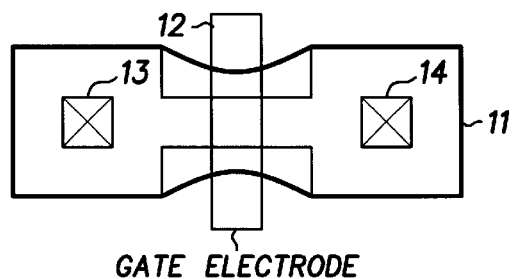
Figure 4C:
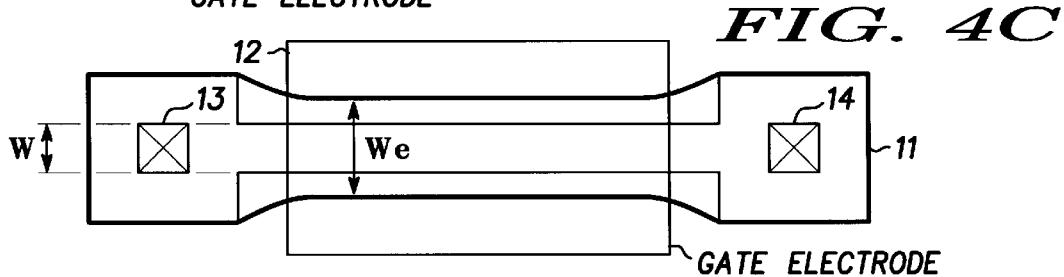

Turning to how to determine this function, FIG. 2(a) described above is a graph for determining ΔW1, which is plotted for W to a such a degree that ΔW2 does not occur; here, the transistor gain is determined for W (for example, it is 1.3 μm or less) to such a degree that ΔW2 occurs as shown in FIG. 2 (b), so that it is plotted as represented by white triangles in the graph. This plot deviates from the extension of the solid line in the area of W where ΔW2 does not occur. Here, because the design value L of channel length is such a degree (for example, 25 μm) that the "effect of lithography" does not occur, the deviated portion where the plot of white rectangles deviates from the extension of the solid line represents an error due to the "effect of stress", that is, ΔW2. Thus, the relationship (function) between the value of W corresponding to the plot of white rectangles and the value of ΔW2 in that plot can be obtained.

Figure 5:
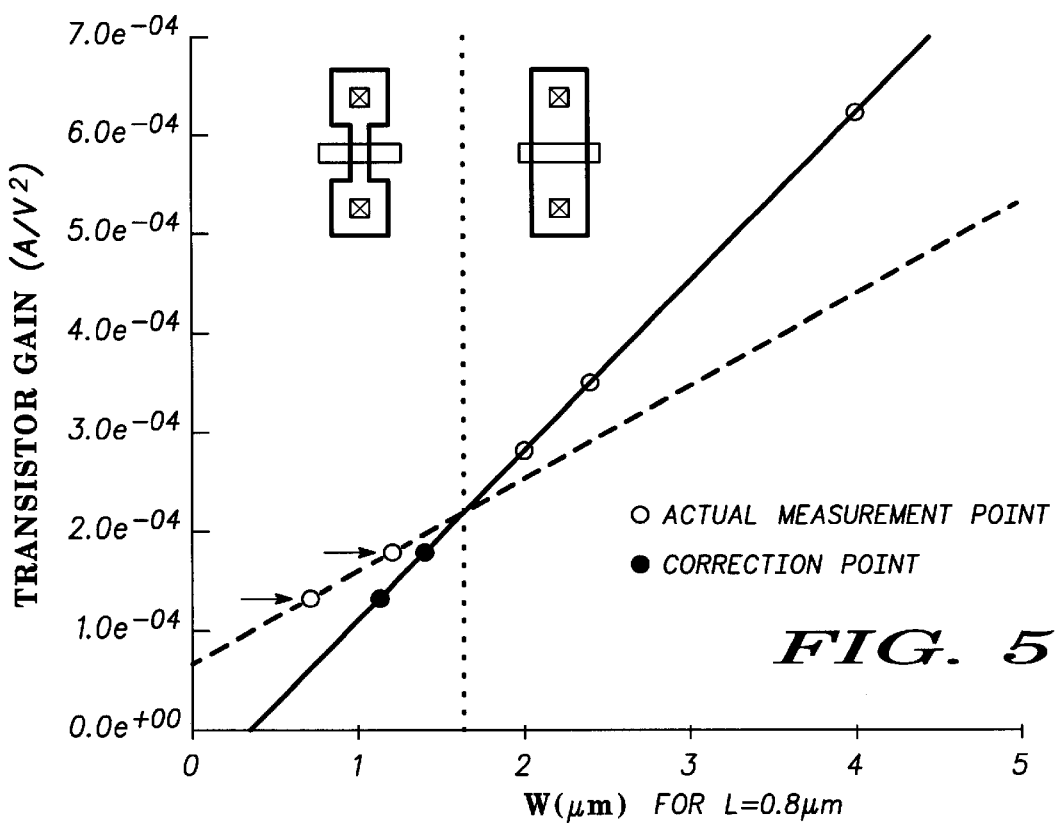
FIG. 5 is a graph for illustrating one example of relationship between design value W of channel width and gate-to-source transistor gain where the design value L of channel length is minuscule.

Next, MOSFETs are fabricated by varying the design value L of channel length over a range where L is scaled down to such a degree that the "effect of lithography" occurs and further varying the design value W of channel length for each L. For each of the MOSFETs fabricated, the gate-to-source transistor gain is measured to determine the relationship between W and transistor gain for each L (Step 4). When L is scaled down, a graph as shown in FIG. 5 is obtained. In this graph, a white circle represents an actual measurement of the transistor gain relative to the design value W of channel width; a black circle represents an effective value of channel width relative to that transistor gain. As shown in this graph, in a area where W is scaled down (an area left to the dotted line 1.6 μm in FIG. 5), the effective value of channel width is greater than the design value, and the resulting error includes an error component ΔW3 due to the "effect of lithography", in addition to an error component ΔW2 due to the "effect of stress."

Figure 6:
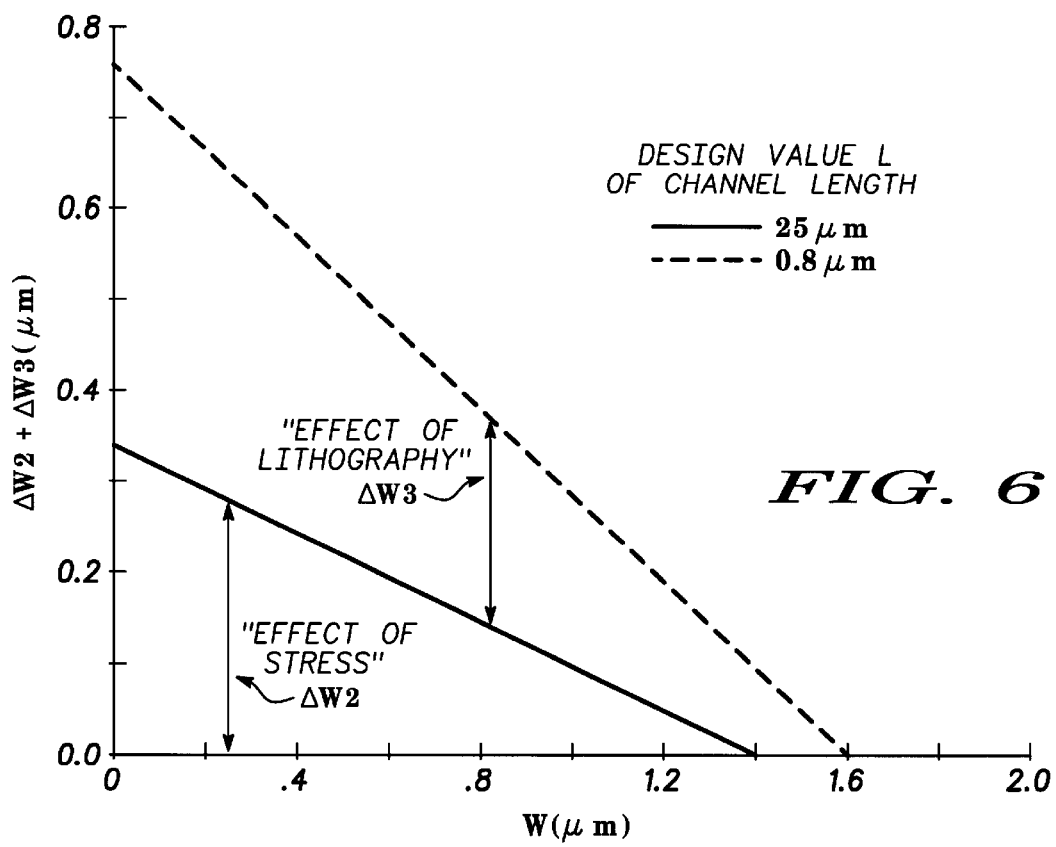
FIG. 6 is a graph for illustrating one example of relationship between design value W of channel width and error due to ΔW2 and ΔW3.

By performing steps 3 and 4 above, a graph as shown in FIG. 6 is obtained. The horizontal axis of this graph denotes the design value W of channel width, while the vertical axis denotes a sum of ΔW2 and ΔW3 (i.e., ΔW2+ΔW3). Thus, an error relative to W can be seen from this graph. It should be noted, however, that FIG. 6 is for a channel length design value L of 0.8 μm.

Figure 7A:
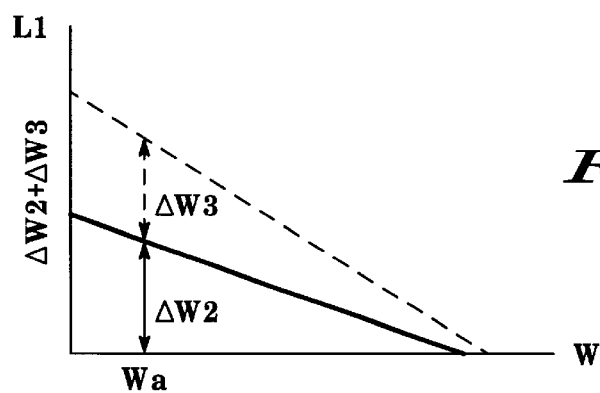
FIGS. 7A–7C is a graph for schematically illustrating the relationship between design value W of channel width and error due to ΔW2 and ΔW3.
Figure 7B:
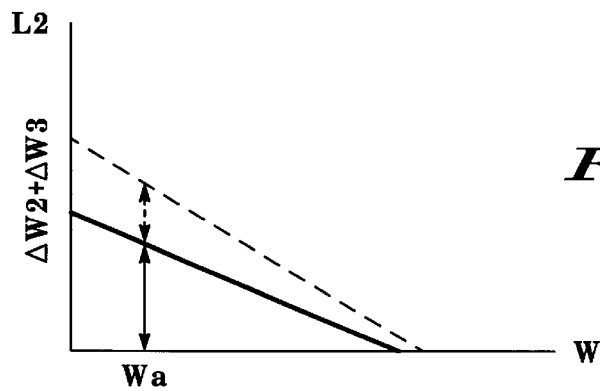
Figure 7C:
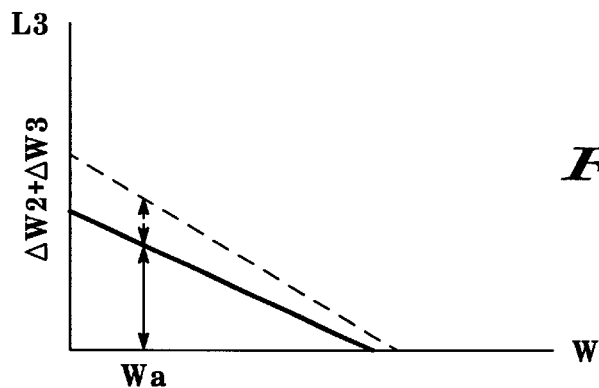

It should be appreciated that ΔW3 is not only a function of W but also a function of L. Thus, as shown in FIG. 7, graphs as shown in FIG. 6 are created for each L, from which the relationship between L and ΔW3 is determined for each value of W (Step 5). FIG. 7 is a graph for schematically illustrating the relationship between design value W of channel width and error due to ΔW2 and ΔW3.

Figure 8:
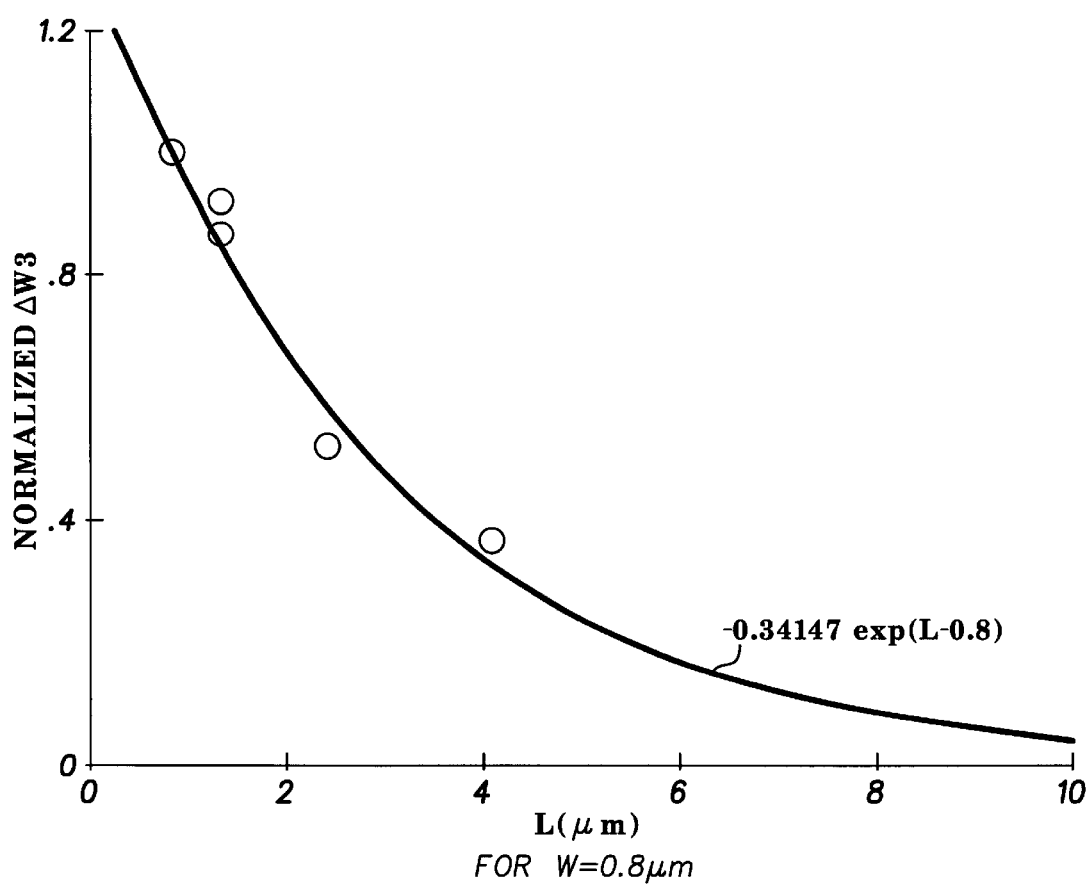
FIG. 8 is a graph for illustrating one example of relationship between design value L of channel length and ΔW3.

More specifically, the dotted line represents (ΔW2+ΔW3), while the solid line represents ΔW2 or a value determined for each W regardless of L. ΔW2 is already determined; as such, if the value for the dotted line is determined, ΔW3 may be obtained by subtracting ΔW2. Referring to Wa, for example, it represents the length indicated by the dotted arrow line; if W is fixed in this way, then the relationship between L and ΔW3 can be determined as an exponential function, for example, as shown in FIG. 8. Thus, W, L, and ΔW3 are obtained as a three-dimensional graph, and these functions may be incorporated into a MOSFET model, or stored as a software correction routine for the design tool.

Subsequently, if the designer uses such a MOSFET model or design tool to set values for channel width W and design value L of channel length, then values ΔW2 and ΔW3 for the correction terms are automatically determined; furthermore, because ΔW1 is already determined, the effective value We of channel width is calculated according to Eq. (3), using ΔW1, ΔW2, and ΔW3. The designer will then predict the electrical characteristic of the device based on the resulting effective value We (Step 6).

According to the above embodiment, the error ΔW2 due to the "effect of stress" and the error ΔW3 due to the "effect of lithography" can be corrected, and the effective value We of channel width can be accurately determined based on the design value W of channel width, so that the electrical characteristic of the MOSFET can be accurately predicated using the resulting effective value We.

Furthermore, according to the above embodiment, because it is based on a relatively simple physical model, modeling or characterization can be implemented easily.

Figure 1:
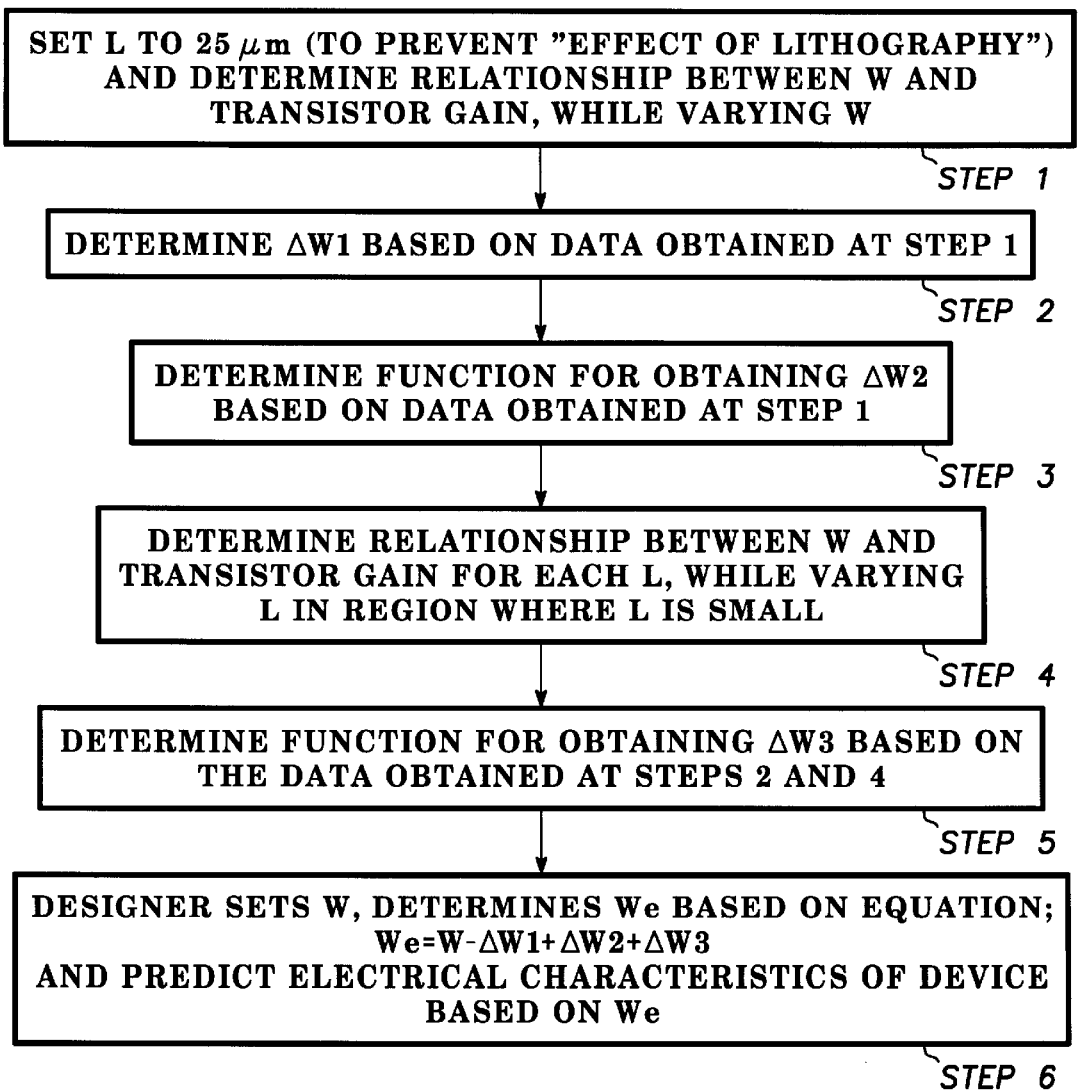
FIG. 1 is a flow chart for describing one example of processing steps according to the present invention.

It should be appreciated that the present invention is not limited to the procedure described in FIG. 1. Furthermore, the present invention may be applicable to both NMOS and PMOS.

Figure 9:
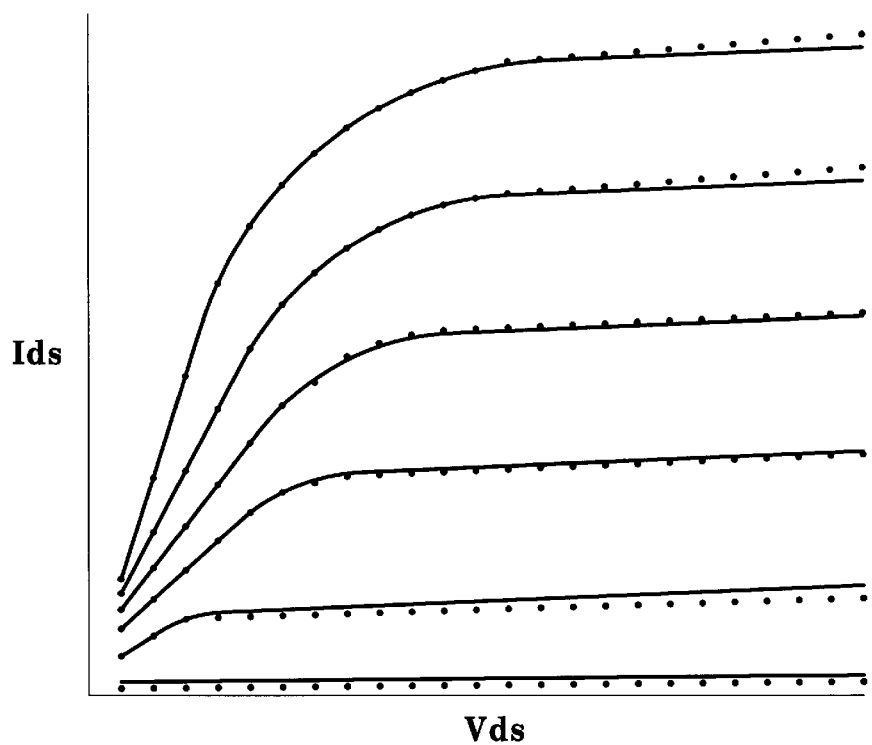
FIG. 9 is a graph depicting the result of embodiment 1.

Below are described embodiments and control example. The design value W of channel width and the design value L of channel length were both set to 0.8 μm at 28° C., and the effective value We of channel width was determined according to Eq. (3), and was used to model the relationship between the drain voltage and drain current; by actually using the design values, NMOSFET was fabricated with a typical process; and by varying the gate voltage for that MOSFET, the drain current was measured while varying the drain voltage (Embodiment 1). The results are shown in FIG. 9. The solid line represents the resulting characterization, while the plot represents the actual measurements.

Figure 10:
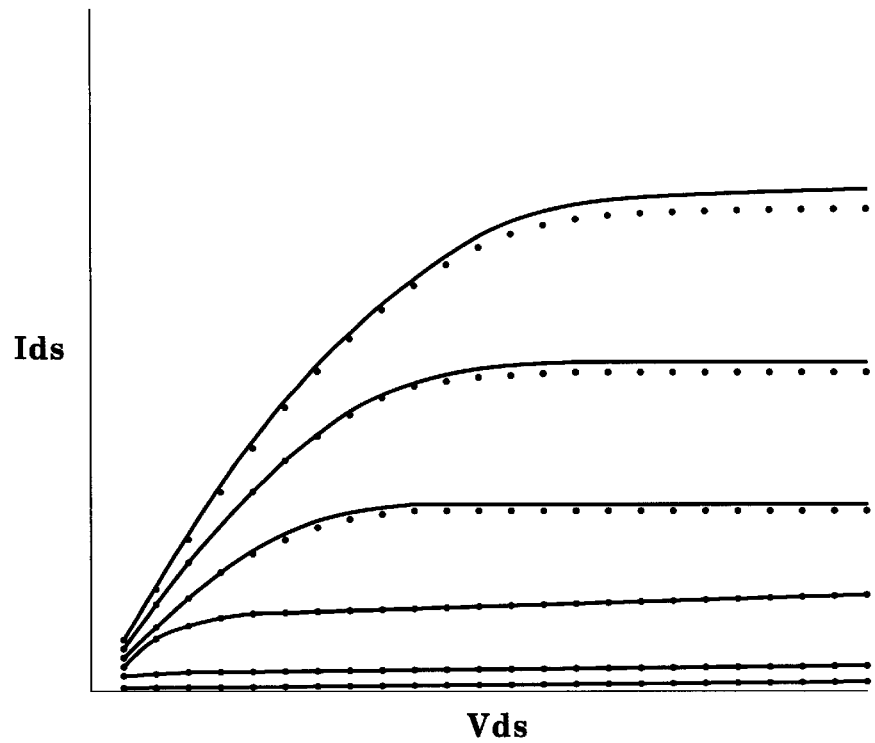
FIG. 10 is a graph depicting the result of embodiment 2.

Similarly, for NMOSFET with W of 0.8 μm and L of 25 μm at 28° C., the relationship between the drain voltage and drain current was characterized by using the effective value We derived from Eq. (3), while actual measurements were made (Embodiment 2). The results are shown in FIG. 10.

Figure 11:
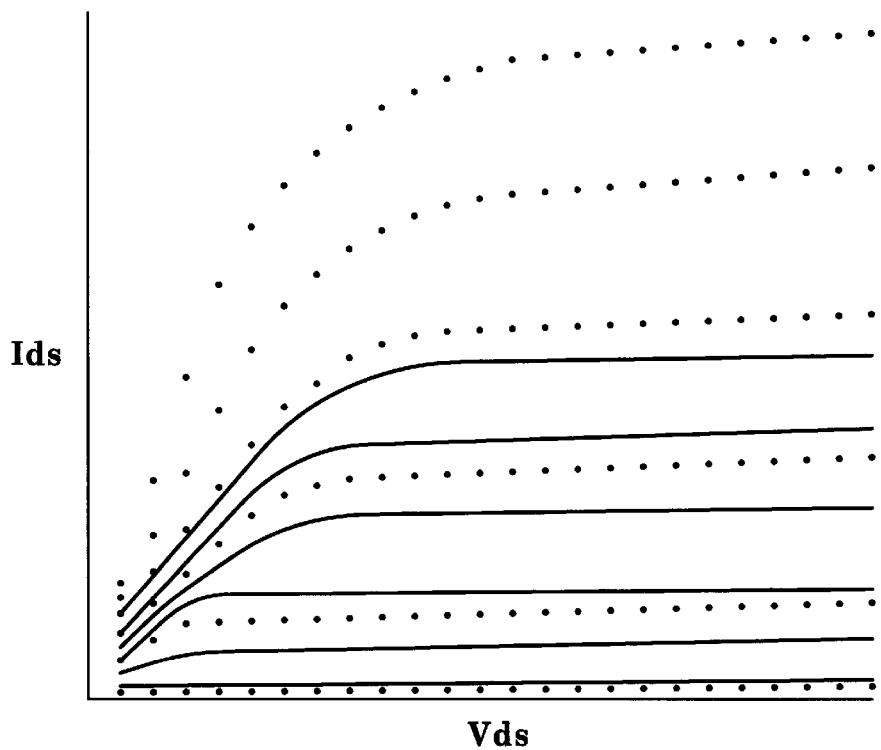
FIG. 11 is a graph depicting the result of control example 1.
Figure 12:
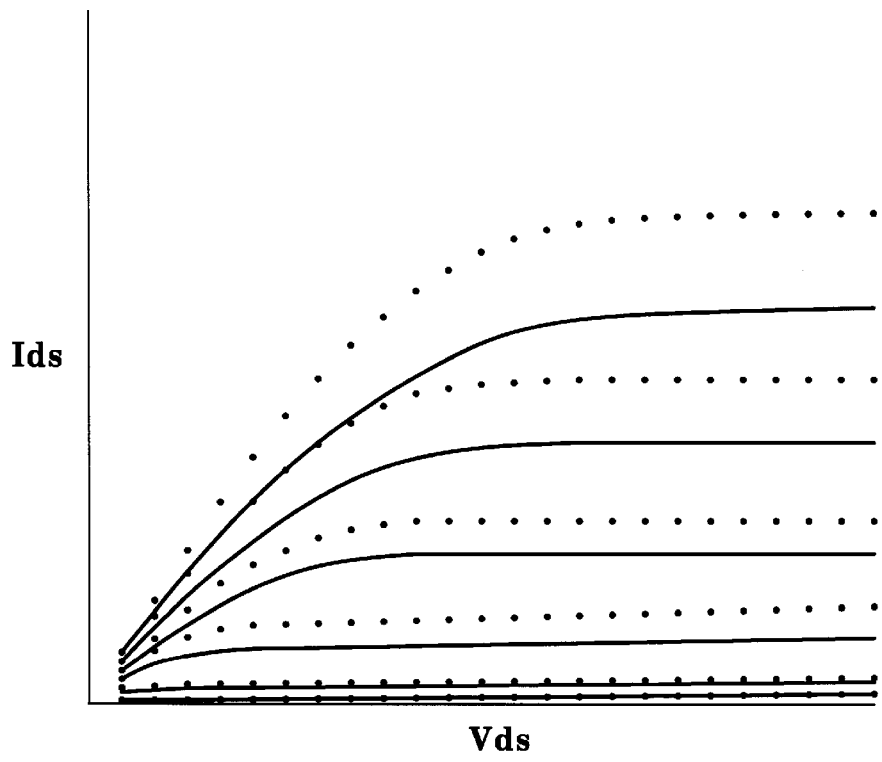
FIG. 12 is a graph depicting the result of control example 2.
Figure 13:
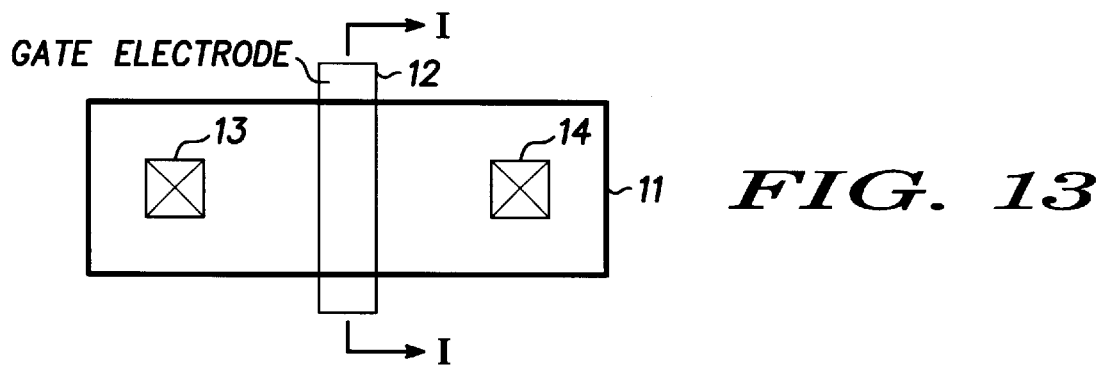
FIG. 13 is a plan view for schematically illustrating a typical MOSFET.
Figure 14:
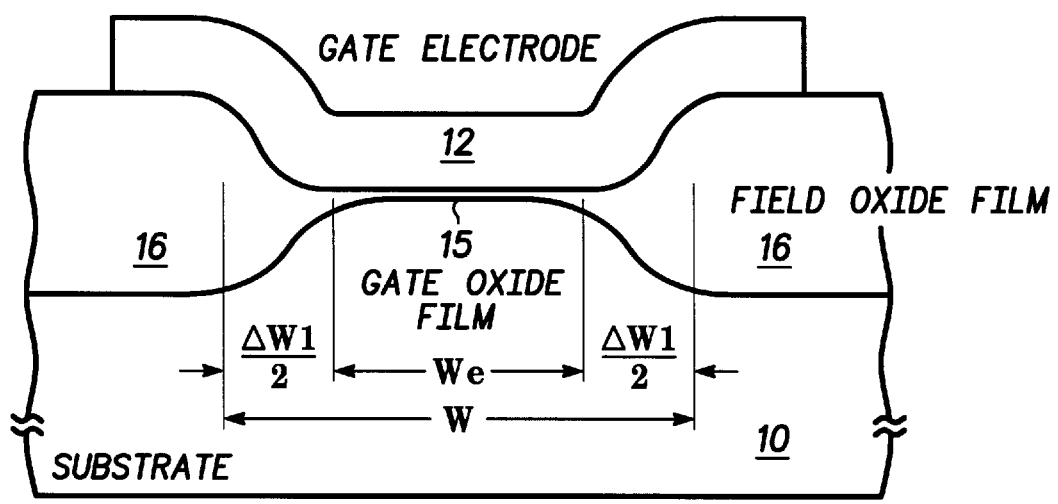
FIG. 14 is a cross-sectional view along I—I of FIG. 13.

As comparisons, given the same design values, the results of characterization of the relationship between the drain voltage and drain current according to Eq. (1) of prior art, instead of Eq. (3), are shown in FIG. 11 (Control Example 1) and FIG. 12 (Control Example 2).

From FIGS. 9–12, it can be seen that the electrical characteristic can be accurately modeled by using the effective value W3 with ΔW1, ΔW2, and ΔW3 corrected according to Eq. (3).

As described above, according to the present invention, because the effective value We of channel width can be accurately determined based on the design value W of channel width, the electrical characteristic of MOSFET can be accurately modeled by using the resulting effective value We.

What is claimed is:

1. A modeling method of MOSFET for modeling an electrical characteristic of a MOSFET in accordance with an effective value of channel width (We), said MOSFET having a channel-forming gate oxide film, a gate electrode disposed on said gate oxide film, and a field oxide film extending continuously across both sides of said gate oxide film, wherein:

said effective value of channel width (We) is determined according to the following equation:

$$We = W - \Delta W1 + \Delta W2 + \Delta W3$$

where W denotes a design value for the channel width, and ΔW1, ΔW2, and ΔW3 denote correction values determined, respectively by:

(a) as W is increased from zero, the gate-to-source transistor gain is substantially zero when W is scaled down; a difference between W and We that occurs due to this effect is represented as ΔW1, which is handled as a value of W when the gate-to-source transistor gain begins to become an effective value greater than zero;

(b) the cross-sectional shape of a portion extending from the field oxide film to the gate oxide film differs depending on whether W is small or large; a difference between W and We that occurs due to this effect is represented as ΔW2, which is handled as a function that increases as W becomes smaller in a region where W is smaller than a certain value; and (c) when the channel width is smaller than the width of the active regions on the source and drain sides and W is also smaller than a certain value, the corners on the source and drain sides are rounded due to the limitations of lithography as seen in a planar view; a difference between W and We that occurs due to this effect is represented as ΔW3, which is handled as a function that increases as W becomes smaller in a region where W is smaller than a certain value, and increases as L become smaller in a region where the gate electrode length L in a direction orthogonal to the channel width direction is smaller than a certain value.

2. A modeling method of MOSFET according to claim 1, wherein the correction value ΔW1 is determined in a manner where:

W and L are set in a range of magnitudes so that ΔW2 and ΔW3 are zero; the magnitude of W is varied in that range to plot a linear graph for W and gate-to-source transistor gain; and the value of W when the extension of this linear graph and transistor gain cross a zero point is regarded as ΔW1.

3. A modeling method of MOSFET according to claim 1, wherein the correction value ΔW2 is determined in a manner wherein:

L is set in a range of magnitudes so that ΔW3 is zero; the magnitude of W is varied in that range to obtain data on W and gate-to-source conductivity; and the value corresponding to the deviated portion of the data obtained in a range where W is small as relative to the extension of the linear graph obtained in a range where W is greater is regarded as ΔW2.

4. A modeling method of MOSFET according to claim 2 wherein the correction value $\Delta W3$ is determined in a manner where:

L is set below a value where a value of $\Delta W3$ occurs; the magnitude of W is varied in that range to obtain data on W and gate-to-source conductivity; the value corresponding to the deviated portion of the data obtained in a range where W is small as relative to the extension of the linear graph obtained in a range where W is greater is determined, from which value is subtracted $\Delta W2$ determined in claim 3 to yield $\Delta W3$.

5. A modeling method of MOSFET according to claim 2, wherein the correction value $\Delta W2$ is determined in a manner wherein:

L is set in a range of magnitudes so that $\Delta W3$ is zero; the magnitude of W is varied in that range to obtain data on W and gate-to-source conductivity; and the value corresponding to the deviated portion of the data obtained in a range where W is small as relative to the extension of the linear graph obtained in a range where W is greater is regarded as $\Delta W2$.

\* \* \* \* \*